United States Patent
Yu et al.

(10) Patent No.: US 10,510,951 B1
(45) Date of Patent: Dec. 17, 2019

(54) LOW TEMPERATURE FILM FOR PCRAM SIDEWALL PROTECTION

(71) Applicant: Taiwan Semiconductor Manufacturing Co., Ltd., Hsin-Chu (TW)

(72) Inventors: Shao-Ming Yu, Zhubei (TW); Jau-Yi Wu, Hsinchu County (TW)

(73) Assignee: Taiwan Semicondutor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/190,702

(22) Filed: Nov. 14, 2018

Related U.S. Application Data

(60) Provisional application No. 62/749,767, filed on Oct. 24, 2018.

(51) Int. Cl.
  *H01L 45/00* (2006.01)
  *H01L 27/24* (2006.01)

(52) U.S. Cl.
  CPC .......... *H01L 45/06* (2013.01); *H01L 45/1233* (2013.01); *H01L 45/1246* (2013.01); *H01L 45/1253* (2013.01); *H01L 45/144* (2013.01); *H01L 45/1641* (2013.01); *H01L 45/1675* (2013.01); *H01L 45/1683* (2013.01); *H01L 27/2436* (2013.01)

(58) Field of Classification Search
  CPC . H01L 29/66007; H01L 45/005; H01L 45/02; H01L 45/128
  See application file for complete search history.

(56) References Cited

U.S. PATENT DOCUMENTS 9,806,255 B1 * 10/2017 Hsu .................... H01L 45/1233

* cited by examiner

*Primary Examiner* — Cheung Lee
(74) *Attorney, Agent, or Firm* — Eschweiler & Potashnik, LLC

(57) ABSTRACT

A method for forming a phase change random access memory (PCRAM) device is provided. The method includes: forming a memory stack over an insulator layer. A first etch process is performed to pattern the memory stack defining a memory cell including a top electrode overlying a dielectric layer. The dielectric layer includes a center region laterally between a first outer region and a second outer region. An etchant used in the first etch process creates a compound in the first and second outer regions, the compound has a first melting point temperature. A first deposition process is performed to form a first sidewall spacer over the memory cell, the first sidewall spacer is in direct contact with outer sidewalls of the memory cell. The first deposition process reaches a first maximum temperature less than the first melting point temperature.

20 Claims, 10 Drawing Sheets

LOW TEMPERATURE FILM FOR PCRAM SIDEWALL PROTECTION

REFERENCE TO RELATED APPLICATION

This Application claims priority to U.S. Provisional Application No. 62/749,767, filed on Oct. 24, 2018, the contents of which are hereby incorporated by reference in their entirety.

BACKGROUND

Flash memory is a widely used type of nonvolatile memory. However, flash memory is expected to encounter scaling difficulties. Therefore, alternatives types of nonvolatile memory are being explored. Among these alternatives types of nonvolatile memory is phase change memory (PCM). PCM is a type of nonvolatile memory in which a phase of a phase change element is employed to represent a unit of data. PCM has fast read and write times, non-destructive reads, and high scalability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
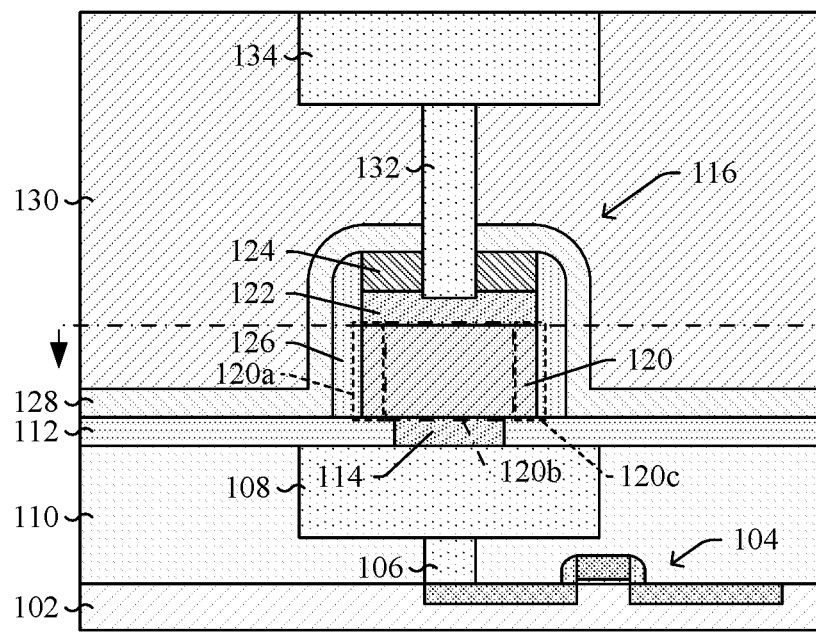
FIG. 1A illustrates a cross-sectional view of some embodiments of a memory device including a phase change element (PCE) and a sidewall spacer, according to the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A phase change memory (PCM) cell includes a phase change element (PCE) sandwiched between a bottom electrode and a top electrode. In typical cases, the PCE is made of chalcogenide glass. Chalcogenide glass has crystalline and amorphous states with drastically different electrical resistivity values, such that the PCE can be switched between the crystalline and amorphous states to correspond to different data states. More particularly, during operation of some PCM cells, the PCE can be heated to a higher temperature (e.g., over 600° C.), which causes the chalcogenide glass to lose its crystallinity. The PCE can then be quickly cooled or "quenched" to "freeze" the PCE in an amorphous, high resistance state, which can for example correspond to a "0" data state. Conversely, by heating the chalcogenide to a lower temperature (e.g., about 100-150 degrees Celsius), wherein the lower temperature is above its crystallization point but below its melting point, the PCE will transform into the low-resistance, crystalline state, which can for example correspond to a "1" state.

During a method for manufacturing this PCM cell, a hardmask is put in place over an un-patterned top electrode layer and un-patterned PCE layer, and an etching process is performed to pattern the top electrode and PCE. Aspects of the present disclosure lie in an appreciation that the etchant used to etch the top electrode and PCE comprises a reactive species (e.g., a halogen element such as fluorine (F), chlorine (Cl), bromine (Br), iodine (I), and/or astatine (At)), and this reactive species reacts and/or combines with outermost sidewalls of the PCE during the etch. Thus, after the etch, a central region of the PCE retains its original composition (e.g., germanium antimony tellurium (GeSbTe), which has a first melting/boiling/sublimation point) while the outermost sidewalls of the PCE are altered to have a second composition (which has a second melting/boiling/sublimation point that is less than the first melting/boiling/sublimation point). For example, the outermost sidewalls of the PCE can be made of a compound that contains GeSbTe and F, Cl, Be, I, and/or At.

Further, the inventors have appreciated that after the top electrode and PCE are etched in this manner, a first sidewall spacer is deposited about sidewalls of the patterned top electrode and patterned PCE to protect the PCE from later processing steps. The first sidewall spacer is deposited at a first maximum temperature that is less than the first melting/boiling/sublimation point (e.g., melting/boiling/sublimation point of the central region of the PCE), but is greater than the second melting/boiling/sublimation point (e.g., melting/boiling/sublimation point of the outermost sidewalls of the PCE). Thus, the outermost sidewalls of the PCE, which contain the reactive species due to the etch, may for example melt during the deposition of the first sidewall spacer. When the outermost sidewalls melt, it can result in voids that undercut the outer edges of the top electrode. These voids can ultimately reduce the PCM cell's performance, stability, structural integrity and/or render the cell inoperable.

Therefore, in some embodiments of the present disclosure, to eliminate the melting/evaporation/sublimation of the compound and formation of the voids in the PCE during manufacturing, a low temperature sidewall spacer may be formed before the first deposition process between the PCE cell and the first sidewall spacer. Formation of the low temperature sidewall spacer requires a low temperature deposition process performed immediately after the first etch process and before the first deposition process. The low temperature deposition process may reach a second maximum temperature (e.g., approximately 250 degrees Celsius) that is less than the first melting/boiling/sublimation point. Thus, in some embodiments the compound within the first and second outer regions will remain bounded by the low-temperature sidewall spacer, and thus, even if the compound does melt or evaporate it will not escape during the low temperature deposition process. Thus, formation of voids will be limited. Further, the low temperature sidewall spacer is comprised of a linear film material (e.g., silicon nitride (SiN)) that will prevent melting and/or evaporation of the compound during any subsequent processing steps such as the first deposition process and/or the BEOL process. This ensures outer sidewalls of the top electrode and outer sidewalls of the PCE remain aligned from the formation of the PCE cell through the end of the subsequent processing steps such as the BEOL process. The formation of the low temperature sidewall spacer prevents the formation of voids and improves the PCM cell's performance, stability, structural integrity, and read/write time.

Referring to FIG. 1A, a cross-sectional view of a memory device 100a in accordance with some embodiments is provided.

The memory device 100a includes a phase change memory (PCM) cell 116. The PCM cell 116 includes: a bottom electrode 114, a phase change element (PCE) 120, a top electrode 122, a hard mask 124, a first sidewall spacer 126, and a second sidewall spacer 128. The bottom electrode 114 is disposed within a dielectric layer 112. The PCE 120 overlies the bottom electrode 114. The top electrode 122 overlies the PCE 120. The hard mask 124 overlies the top electrode 122. The first sidewall spacer 126 directly contacts outer sidewalls of the PCE 120, outer sidewalls of the top electrode 122, and outer sidewalls of the hard mask 124. The second sidewall spacer 128 directly contacts outer sidewalls of the first sidewall spacer 126 and extends continuously from an upper surface of the hard mask layer 124 to an upper surface of the dielectric layer 112. In some embodiments, the second sidewall spacer 128 is comprised of a material different from the first sidewall spacer 126.

The PCM cell 116 is often disposed over a substrate 102 with an inter-metal layer (ILD) layer 110 disposed over the substrate 102. A bottom conductive wire 108 overlying a bottom interconnect via 106 electrically couples the PCM cell 116 to a transistor 104. In some embodiments, the bottom conductive wire 108 and bottom interconnect via 106 electrically couple the PCM cell 116 to underlying metal layers and/or an electrical component such as a resistor, a capacitor, and/or a diode. An inter-metal dielectric (IMD) layer 130 is disposed over the PCM cell 116. A conductive via 132 is disposed over the top electrode 122, and connects the top electrode 122 to upper metal layers such as an upper conductive wire 134. The conductive via 132 and the upper conductive wire 134 reside within the IMD layer 130 and may, for example, electrically couple the top electrode 122 to a bit line (not shown).

In some embodiments, during operation of the PCM cell 116, the PCM cell 116 varies between states depending upon a voltage applied from the upper conductive wire 134 to the bottom conductive wire 108. The PCM cell 116 may, for example, be in a low-resistance state where the PCE 120 is in a crystalline phase. Changing the PCE 120 to the crystalline phase may, for example, be performed at a relatively low temperature (e.g., within a range of approximately 100 to 150 degrees Celsius). The PCM cell 116 may, for example, be in a high resistance state where the PCE 120 is in an amorphous phase. Changing the PCE 120 to the amorphous phase may, for example, be performed at a relatively high temperature (e.g., approximately 600 degrees Celsius).

In some embodiments, the PCE 120 comprises a center region 120b sandwiched between a first outer region 120a and a second outer region 120c. The PCE 120 is comprised of a first material. In various embodiments, the first material may, for example, be or comprise a phase change material, germanium-antimony-tellurium (GeSbTe), or the like. In some embodiments, the first and second outer regions 120a, 120c may, for example, comprise a compound of the first material and a reactive species while the center region 120b comprise the first material. In some embodiments, the reactive species may, for example, be or comprises a halogen element (e.g., group 17 element) such as fluorine (F), chlorine (Cl), bromine (Br), iodine (I), and/or astatine (At). In various embodiments, the first and second outer regions 120a, 120c are absent of any voids. In various embodiments, the PCE 120 is a continuous layer extending from a lower surface of the top electrode 122 to the upper surface of the dielectric layer 112 and an upper surface of the bottom electrode 114. Outer sidewalls of the PCE 120 are aligned with outer sidewalls of the top electrode 122 and outer sidewalls of the hard mask 124. The first sidewall spacer 126 directly contacts the outer sidewalls of the PCE 120, the outer sidewalls of the top electrode 122, and the outer sidewalls of the hard mask 124. The first sidewall spacer 126 is configured and/or formed in such a manner to prevent the compound in the first and second outer regions 120a, 120c from melting and/or evaporating from the PCE 120 during operation and/or formation of the PCM cell 116. In some embodiments, the first sidewall spacer 126 is configured to prevent outgassing and/or diffusion of the compound in the first and second outer regions 120a, 120c from the PCE 120. In the aforementioned embodiment, the first sidewall spacer 126 comprises a material with grains that are small compared to the PCE 120 and/or the compound, so grain boundaries of the first sidewall spacer 126 are too small for the compound to diffuse or otherwise move through the first sidewall spacer 126 along the grain boundaries. By preventing the compound from melting, evaporating, diffusing, and/or outgassing, the likelihood of device breakdown is reduced. Therefore, the first sidewall spacer 126 increases the performance, stability, and structural integrity of the PCM cell 116.

In some embodiments, the first and second outer regions 120a, 120c are defined from a cross-sectional view. For example, if when viewed from above the PCM cell 116 is circular/elliptical then the first and second outer regions 120a, 120c are a single continuous outer region when viewed from above (see e.g., FIG. 1B), therefore the first and second outer regions 120a, 120c refers to the nature of this single continuous outer region when depicted in in a cross-sectional view. Additionally, if when viewed from above the PCM cell 116 is circular or elliptical then any length and/or width associated with a cross-sectional view of the layers comprising the PCM cell 116 respectively correspond to diameters of a circle or lengths defined between two vertices on the major axis of an ellipse.

In some embodiments, the PCE 120 may, for example, be or comprise chalcogenide materials, which consist of at least one chalcogen ion (e.g., a chemical element in column VI of the period table), sulfur (S), selenium (Se), tellurium (Te), selenium sulfide (SeS), germanium antimony tellurium (GeSbTe), silver indium antimony tellurium (AgInSbTe), or the like formed to a thickness within a range of approximately 10 nanometers to approximately 100 nanometers. In some embodiments, the top electrode 122 and the bottom electrode 114 may be or comprise the same material as one another. In some embodiments, the top electrode 122 and/or the bottom electrode may, for example, respectively be or comprise titanium nitride (TiN), titanium tungsten (TiW), titanium tungsten nitride (TiWN), titanium tantalum nitride (TiTaN), tantalum nitride (TaN), tungsten (W), or the like formed to a thickness within a range of approximately 5 nanometers to approximately 15 nanometers. In some embodiments, the hard mask layer 124 may, for example, be or comprise silicon carbide (SiC), silicon nitride (SiN), silicon oxynitride (SiON), or the like formed to a thickness within a range of approximately 10 nanometers to approximately 13 nanometers. In some embodiments, the first sidewall spacer 126 may, for example, be or comprise SiN, SiON, silicon oxide, SiC, or the like formed with a low temperature (less than approximately 250 degrees Celsius) and formed to a thickness within a range of approximately 5 nanometers to approximately 30 nanometers. In some embodiments, the first sidewall spacer 126 may, for example, be a material and/or combination of materials with a density within a range of approximately 2.5 to 4 g/cm$^3$ and a reflective index within a range of approximately 1.5 to 3. In various embodiments, the first sidewall spacer 126 comprises a material formed to a thickness with a maximum deposition temperature less than a melting, boiling, and/or sublimation temperature of the compound. In some embodiments, the second sidewall spacer 128 may, for example, be or comprise SiC, silicon oxycarbide (SiOC), or the like formed to a thickness within a range of approximately 20 nanometers to approximately 30 nanometers. In some embodiments, the conductive via 132 and the upper conductive wire 134 may, for example, respectively be or comprise copper (Cu), aluminum (Al), or the like. In some embodiments, the dielectric layer 112 may, for example, be or comprise SiN, SiC, SiON, SiOC, or the like formed to a thickness within a range of approximately 15 nanometers to approximately 25 nanometers. In some embodiments, the IMD layer 130 may, for example, be or comprise tetra-ethyl-ortho-silicate (TEOS) (e.g., plasma enhanced TEOS, low particle TEOS, etc.), an extreme low κ dielectric, or the like.

In some embodiments, the compound may, for example, be or comprise a combination of germanium (Ge), antimony (Sb), and/or tellurium (Te) with at least one of the halogen elements. In various embodiments, the compound is a plurality of combinations of the aforementioned embodiment, for example, the compound may be $GeF_2$, $GeF_4$, $SbF_5$, $SbF_3$, $TeF_4$, $TeF_6$, $GeCl_4$, $GeCl_2$, $SbCl_3$, $SbCl_5$, $TeCl_2$, $[TeCl_4]_4$, $GeBr_4$, $GeBr_2$, $SbBr_3$, $TeBr_2$, $[TeBr_4]_4$, a plurality of the aforementioned, and/or the like. In some embodiments, the melting, boiling, and/or sublimation temperature of the compound is less than a deposition temperature of the first sidewall spacer.

Figure 1B:
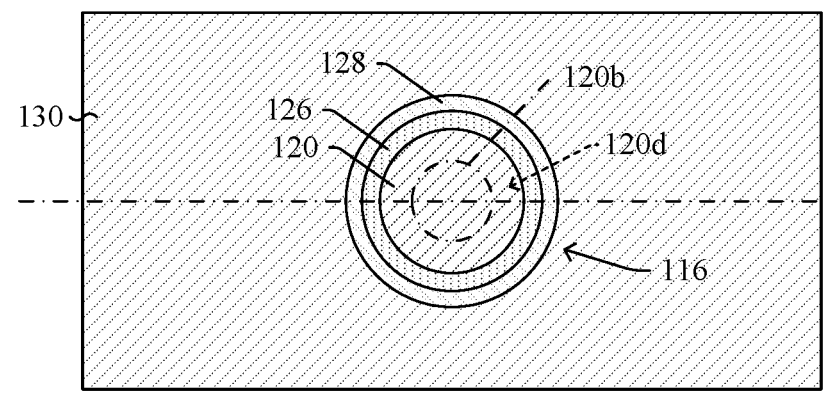
FIG. 1B illustrates a top view of the memory device of FIG. 1A, as indicated by the cut-line in FIG. 1A, according to the present disclosure.

Referring to FIG. 1B, a top view 100b of FIG. 1A's memory device 100a as indicated in the cut-away lines shown in FIG. 1A in accordance with some embodiments is provided.

The PCM cell 116 may, for example, have a circular shape when viewed from above in some embodiments. The PCE 120 comprises the center region 120b and an outer region 120d. The outer region 120d is defined from an outer perimeter of the center region 120b to an outer perimeter of the PCE 120. In some embodiments, the outer region 120d comprises the first and second outer regions (120a, 120c of FIG. 1A). In some embodiments, the outer region 120d comprises the compound while the center region 120b comprises the first material. In various embodiments, the outer region 120d is absent of voids.

Figure 2A:
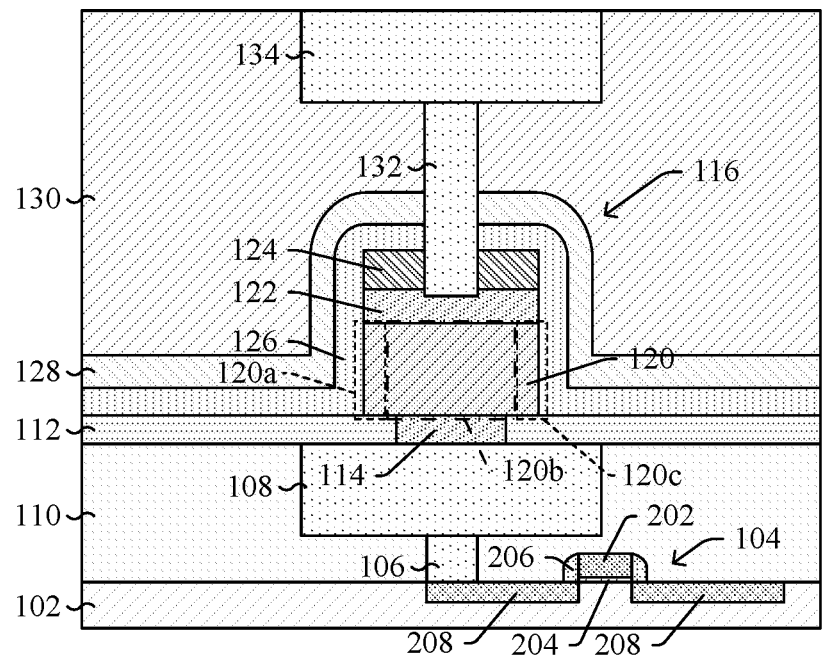
FIGS. 2A-2F illustrate cross-sectional views of various alternative embodiments of the memory device of FIG. 1A, according to the present disclosure.

Referring to FIG. 2A, a cross-sectional view 200a of some alternative embodiments of the memory device of FIG. 1A is provided in which the first sidewall spacer 126 extends continuously from the upper surface of the hard mask 124 to the upper surface of the dielectric layer 112. The second sidewall spacer 128 directly contacts an upper surface of the first sidewall spacer 126. In some embodiments, a lower surface of the conductive via 132 is below an upper surface of the top electrode 122. In some embodiments, the lower surface of the conductive via 132 is in direct contact with the upper surface of the top electrode 122.

The transistor 104 includes gate electrode 202, gate dielectric 204, transistor sidewall spacers 206, and source/drain regions 208. The bottom interconnect via 106 is electrically coupled to a source/drain region 208 of the transistor 104. The source/drain regions 208 are disposed within the substrate 102 on either side of the gate electrode 202. Further, the source/drain regions 208 are doped to have a first conductivity type which is opposite a second conductivity type of a channel region under the gate dielectric 204. The gate electrode 202 may be, for example, doped polysilicon or a metal, such as aluminum, copper, or combinations thereof. The gate dielectric 204 may be, for example, an oxide, such as silicon dioxide, or a high-κ dielectric material. The transistor sidewall spacers 206 can be made of silicon nitride (e.g., $Si_3N_4$), for example.

Figure 2B:
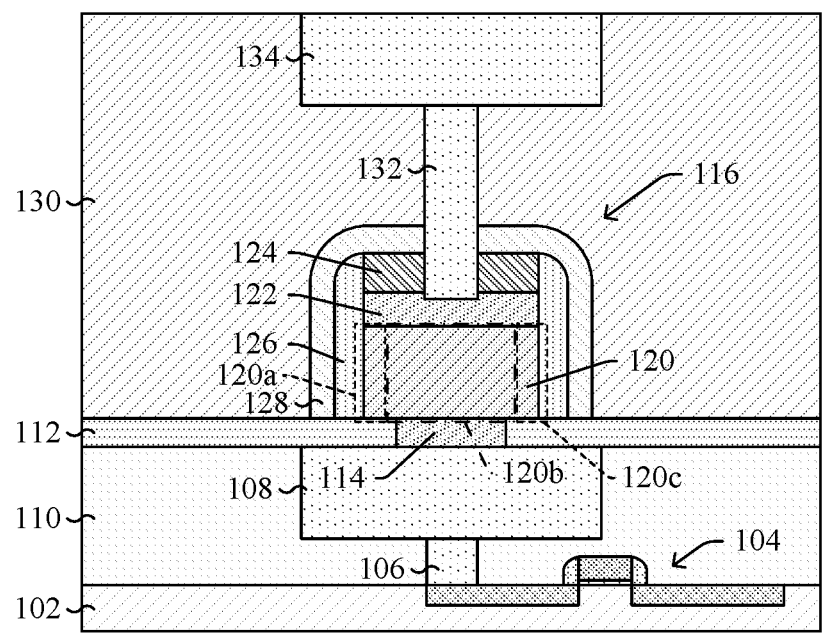

Referring to FIG. 2B, a cross-sectional view 200b of some alternative embodiments of the memory device of FIG. 1A is provided in which the second sidewall spacer 128 covers a portion of the upper surface of the dielectric layer 112.

Figure 2C:
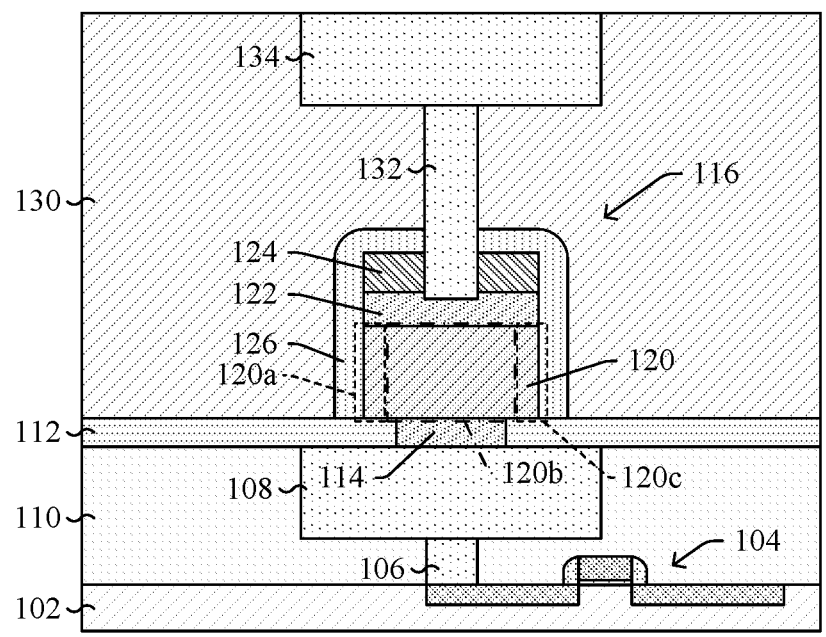

Referring to FIG. 2C, a cross-sectional view 200c of some alternative embodiments of the memory device of FIG. 1A is provided in which the second sidewall spacer (128 of FIG. 1A) is omitted and a lower surface of the IMD layer 130 is in direct contact with the upper surface of the dielectric layer 112.

Figure 2D:
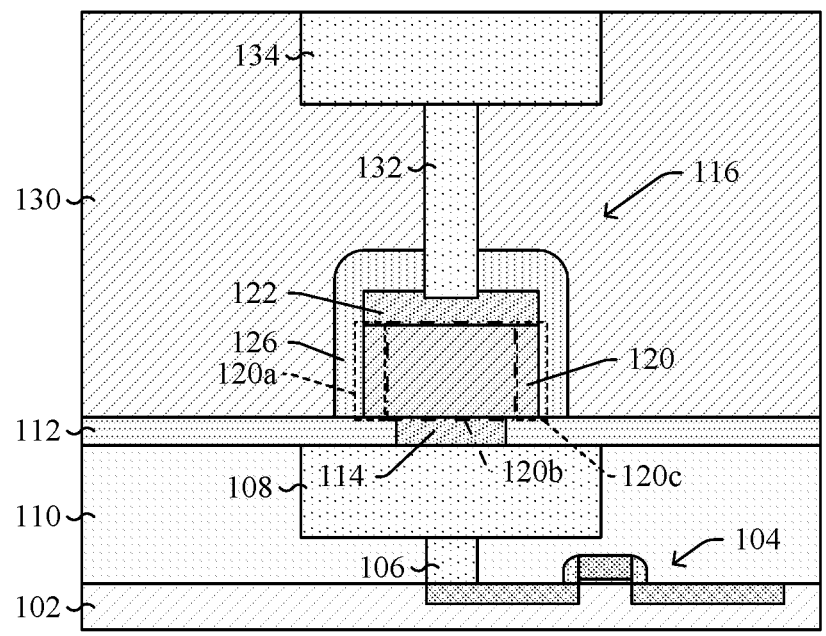

Referring to FIG. 2D, a cross-sectional view 200d of some alternative embodiments of the memory device of FIG. 1A is provided in which the second sidewall spacer (128 of FIG. 1A) is omitted and a lower surface of the IMD layer 130 is in direct contact with the upper surface of the dielectric layer 112. Additionally, the hard mask (124 of FIG. 1A) is omitted and the first sidewall spacer 126 directly contacts an upper surface of the top electrode 122.

Figure 2E:
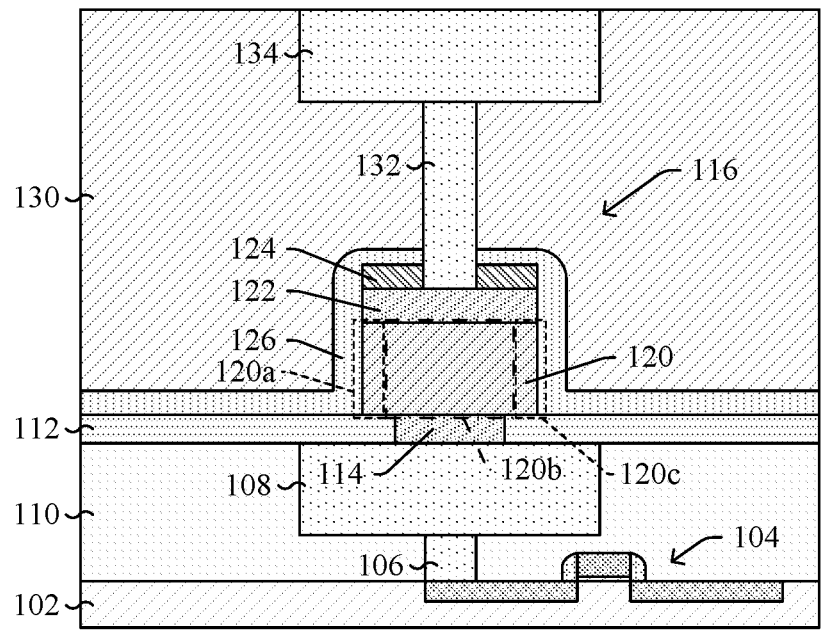

Referring to FIG. 2E, a cross-sectional view 200e of some alternative embodiments of the memory device of FIG. 1A is provided in which the second sidewall spacer (128 of FIG.

1A) is omitted. The first sidewall spacer 126 extends continuously from the upper surface of the hard mask 124 to the upper surface of the dielectric layer 112. A lower surface of the conductive via 132 directly contacts an upper surface of the top electrode 122 at a horizontal line.

Figure 2F:
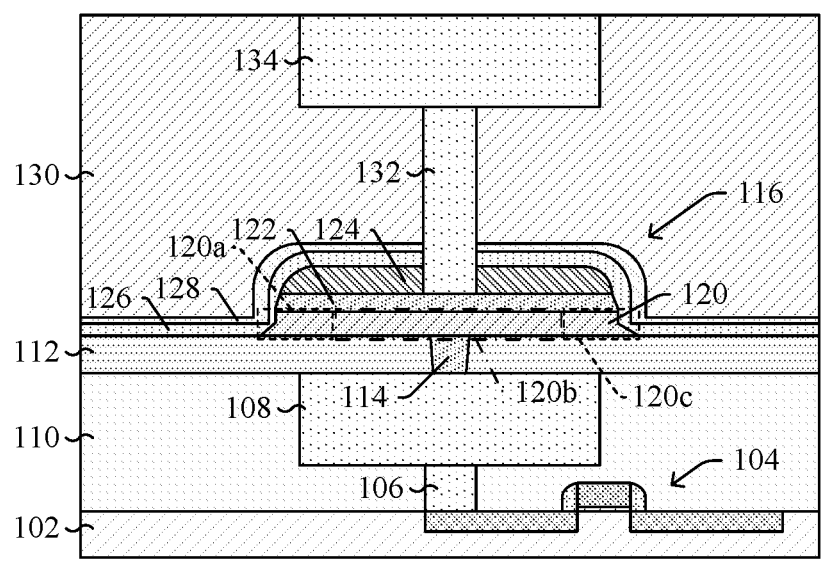

Referring to FIG. 2F, a cross-sectional view 200f of some alternative embodiments of the memory device of FIG. 1A is provided in which the first sidewall spacer 126 extends continuously from the upper surface of the hard mask 124 to the upper surface of the dielectric layer 112. The second sidewall spacer 128 directly contacts an upper surface of the first sidewall spacer 126. In some embodiments, a maximum width of the PCE 120 is greater than a maximum width of the top electrode 122. In some embodiments, outer sidewalls of the bottom electrode 114 are within outer sidewalls of the conductive via 132 and/or within outer sidewalls of the bottom interconnect via 106. In various embodiments, outer sidewalls of the PCE 120, outer sidewalls of the top electrode 122, and outer sidewalls of the hard mask 124 are outside outer sidewalls of the upper conductive wire 134 and/or outer sidewalls of the bottom conductive wire 108.

Figure 3:
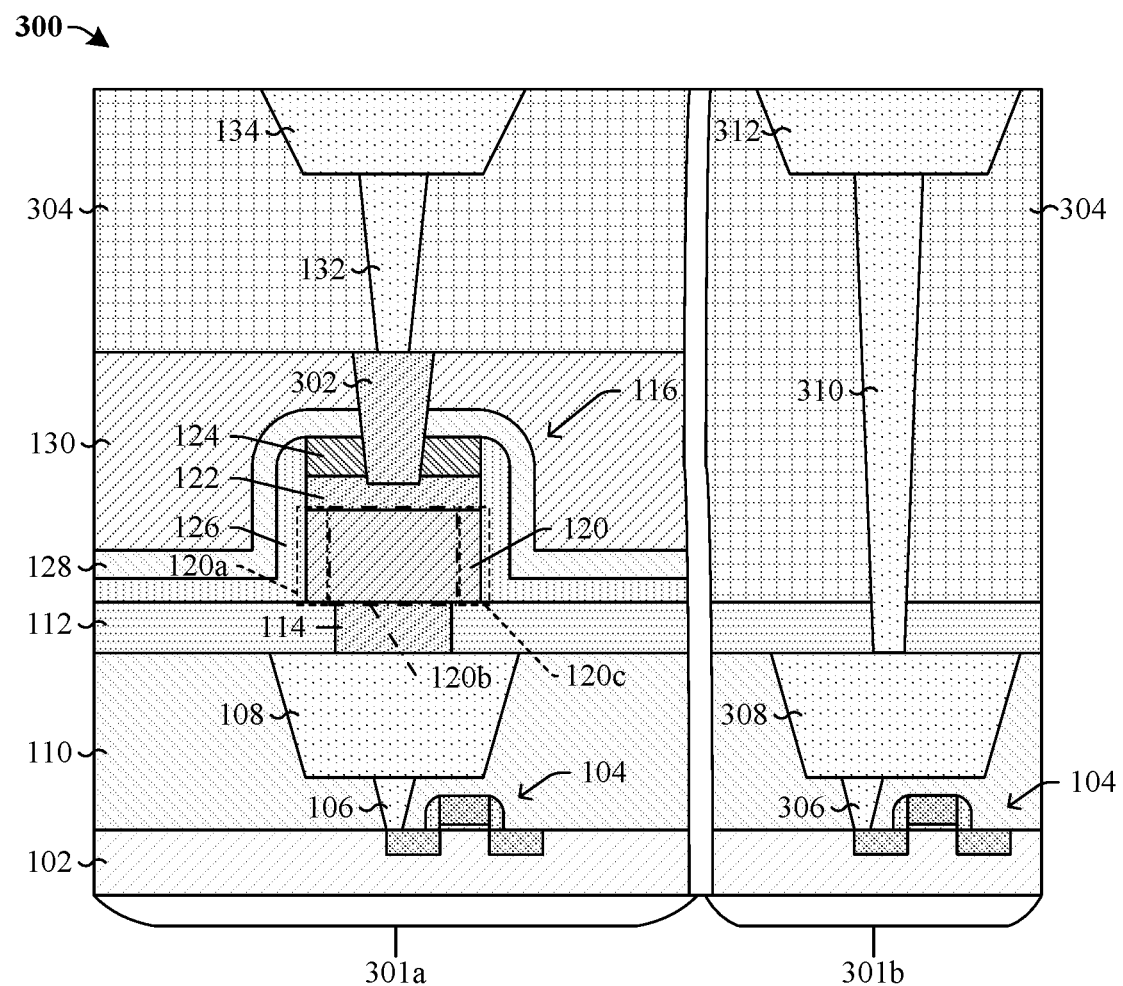
FIG. 3 illustrates a cross-sectional view of some embodiments of a memory device including a memory region and a logic region, according to the present disclosure.

Referring to FIG. 3, a cross-sectional view of a memory device 300 including a memory array region 301a comprising a PCM cell 116 and a logic region 301b, in accordance with some embodiments is provided. In various embodiments, the PCM cell 116 within the memory array region 301a is as the PCM cell 116 of FIG. 2A is described and labeled.

Within the memory array region 301a a top electrode via 302 is disposed within the IMD layer 130 and electrically couples the top electrode 122 to the conductive via 132. In some embodiments, the top electrode via 302 is the same material as the top and bottom electrodes 122, 114. In some embodiments, the top electrode via 302 is a different material than the conductive via 132 and the upper conductive wire 134. In some embodiments, a lower surface of the top electrode via 302 is aligned with an upper surface of the top electrode 122 (not shown). The conductive via 132 and the upper conductive wire 134 reside within a second IMD layer 304. The second IMD layer 304 extends continuously from the memory array region 301a to the logic region 301b.

Within the logic region 301b a transistor 104 is disposed within the substrate 102 and the ILD layer 110. The transistor 104 is electrically coupled to an interconnect wire 308 via a conductive contact 306. A second conductive via 310 is disposed within the second IMD layer 304 and the dielectric layer 112. In some embodiments, the second conductive via 310 may, for example, be or comprise Cu, Al, or the like. A second conductive wire 312 overlies the second conductive via 310. In some embodiments, the second conductive wire 312 may, for example, be or comprise Cu, Al, or the like.

Figure 4:
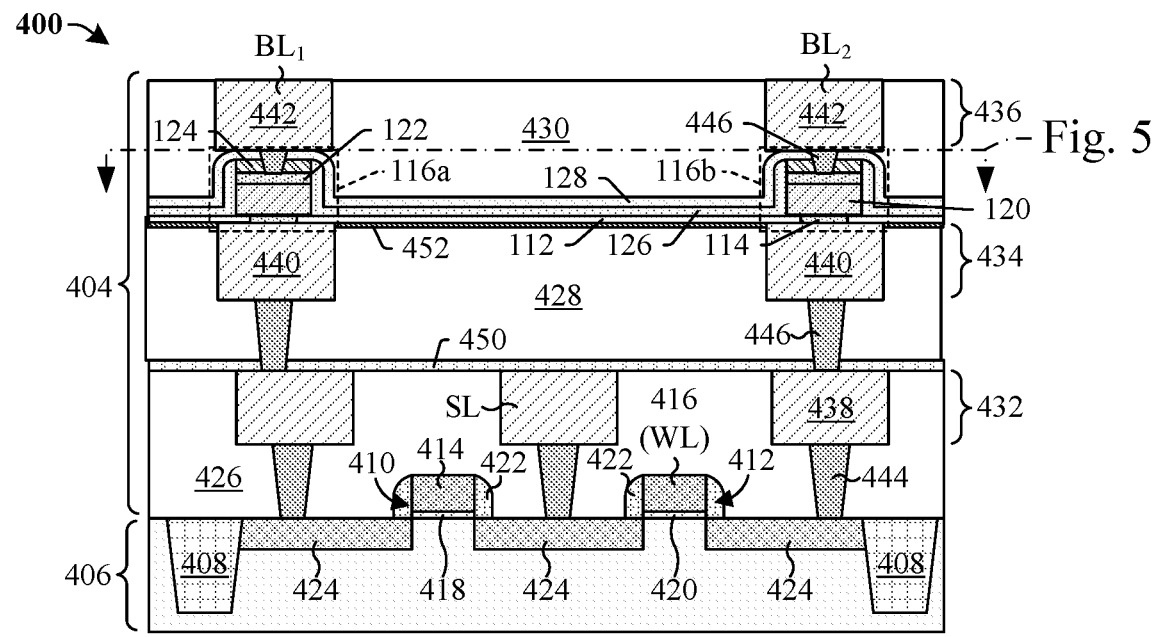
FIG. 4 illustrates a cross-sectional diagram illustrating some embodiments of an integrated circuit (IC) including memory devices respectively including a phase change element (PCE) and a sidewall spacer, according to the present disclosure.

Referring to FIG. 4, a cross sectional view of some embodiments of an integrated circuit 400, which includes a first memory cell 116a and a second memory cell 116b disposed in an interconnect structure 404 of the integrated circuit 400. In some embodiments, the first and second memory cells 116a, 116b are each as the PCM cell 116 of FIG. 2A is illustrated and described.

The integrated circuit 400 includes a substrate 406. The substrate 406 may be, for example, a bulk substrate (e.g., a bulk silicon substrate) or a silicon-on-insulator (SOI) substrate. The illustrated embodiment depicts one or more shallow trench isolation (STI) regions 408, which may include a dielectric-filled trench within the substrate 406.

Two access transistors 410, 412 are disposed between the STI regions 408. The access transistors 410, 412 include access gate electrodes 414, 416, respectively; access gate dielectrics 418, 420, respectively; access sidewall spacers 422; and source/drain regions 424. The source/drain regions 424 are disposed within the substrate 406 between the access gate electrodes 414, 416 and the STI regions 408, and are doped to have a first conductivity type which is opposite a second conductivity type of a channel region under the gate dielectrics 418, 420, respectively. The access gate electrodes 414, 416 may be, for example, doped polysilicon or a metal, such as aluminum, copper, or combinations thereof. The access gate dielectrics 418, 420 may be, for example, an oxide, such as silicon dioxide, or a high κ dielectric material. The access sidewall spacers 422 can be made of silicon nitride (e.g., $Si_3N_4$), for example. In some embodiments, the access transistor 410 and/or the access transistor 412 may, for example, be electrically coupled to a word line (WL) such that an appropriate WL voltage can be applied to the access gate electrode 414 and/or the access gate electrode 416.

The interconnect structure 404 is arranged over the substrate 406 and couples devices (e.g., transistors 410, 412) to one another. The interconnect structure 404 includes a plurality of IMD layers 426, 428, 430, and a plurality of metallization layers 432, 434, 436 which are layered over one another in alternating fashion. The IMD layers 426, 428, 430 may be made, for example, of a low κ dielectric, such as un-doped silicate glass, or an oxide, such as silicon dioxide, or an extreme low κ dielectric layer. The metallization layers 432, 434, 436 include metal lines 438, 440, 442, which are formed within trenches, and which may be made of a metal, such as copper or aluminum. Contacts 444 extend from the bottom metallization layer 432 to the source/drain regions 424 and/or gate electrodes 414, 416; and vias 446 extend between the metallization layers 432, 434, 436. The contacts 444 and the vias 446 extend through dielectric-protection layers 450, 452 (which can be made of dielectric material and can act as etch stop layers during manufacturing). The dielectric-protection layers 450, 452 may be made of an extreme low κ dielectric material, for example. The contacts 444 and the vias 446 may be made of a metal, such as copper or tungsten, for example.

The first and second memory cells 116a, 116b, which are configured to store respective data states, are arranged within the interconnect structure 404 between neighboring metal layers. The first and second memory cells 116a, 116b respectively include: a bottom electrode 114, a phase change element (PCE) 120, a top electrode 122, a hard mask 124, a first sidewall spacer 126, and a second sidewall spacer 128. The first and second memory cells 116a, 116b are respectively connected to a first bit-line ($BL_1$) and a second bit-line ($BL_2$) through the metal lines 442.

Figure 5:
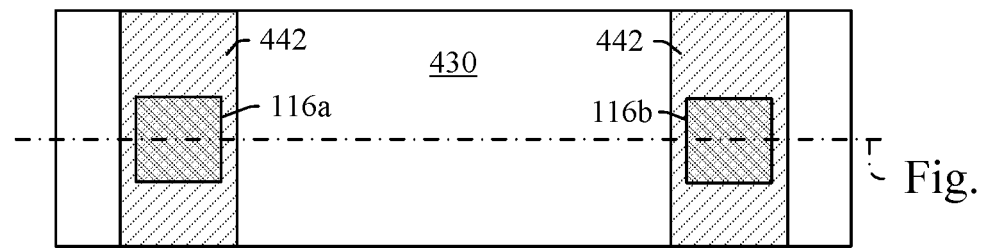
FIG. 5 illustrates a top view of the memory device of FIG. 4, as indicated by the cut-line in FIG. 4, according to the present disclosure.

Referring to FIG. 5, a top view of some embodiments of FIG. 4's integrated circuit 400 as indicated in the cut-away lines shown in FIGS. 4-5.

The first and second memory cells 116a, 116b can have a square or circular shape when viewed from above in some embodiments. In other embodiments, however, for example due to practicalities of many etch processes, the corners of the illustrated square shape can become rounded, resulting in first and second memory cells 116a, 116b having a square shape with rounded corners, or having a circular shape. The first and second memory cells 116a, 116b are arranged over metal lines (440 of FIG. 4), respectively, and have upper portions in direct electrical connection with the metal lines 442, respectively.

FIGS. 6-11 illustrate cross-sectional views 600-1100 of some embodiments of a method of forming a memory device including a PCM structure according to the present disclosure. Although the cross-sectional views 600-1100 shown in FIGS. 6-11 are described with reference to a method, it will be appreciated that the structures shown in FIGS. 6-11 are not limited to the method but rather may stand alone separate of the method. Although FIGS. 6-11 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 6:
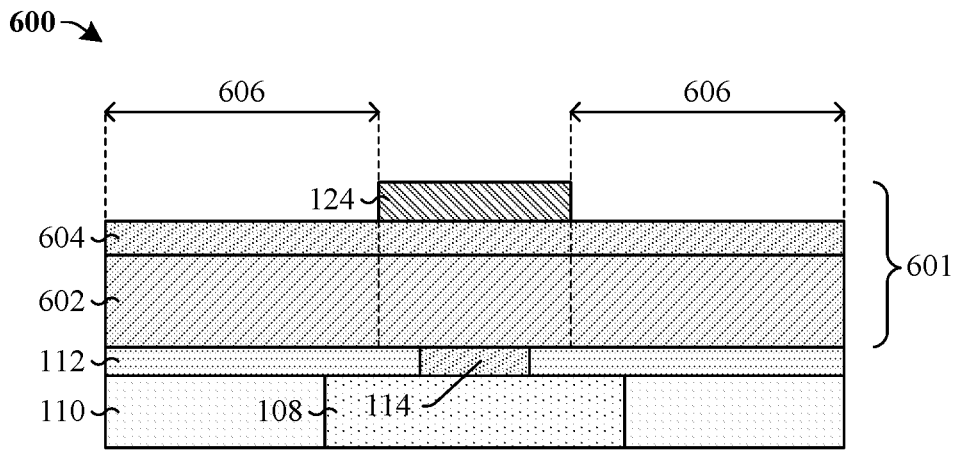
FIGS. 6-11 illustrate cross-sectional views and a top view of some embodiments of a method of forming a memory device, according to the present disclosure.

As shown in cross-sectional view 600 of FIG. 6, an initial structure comprises: a bottom conductive wire 108 within an ILD layer 110; a dielectric layer 112 over the bottom conductive wire 108 and the ILD layer 110; a bottom electrode 114 within the dielectric layer 112 overlying the bottom conductive wire 108; and a PCM stack 601 over the dielectric layer 112 and the bottom electrode 114. The PCM stack 601 includes: a hard mask 124 overlying a top electrode layer 604 and a PCE layer 602 underlying the top electrode layer 604. The hard mask 124 covers a memory region of the underlying layers and leaves sacrificial regions 606 uncovered. In some embodiments, the PCE layer 602 may, for example, be or comprise a first material such as GeSbTe.

Figure 7:
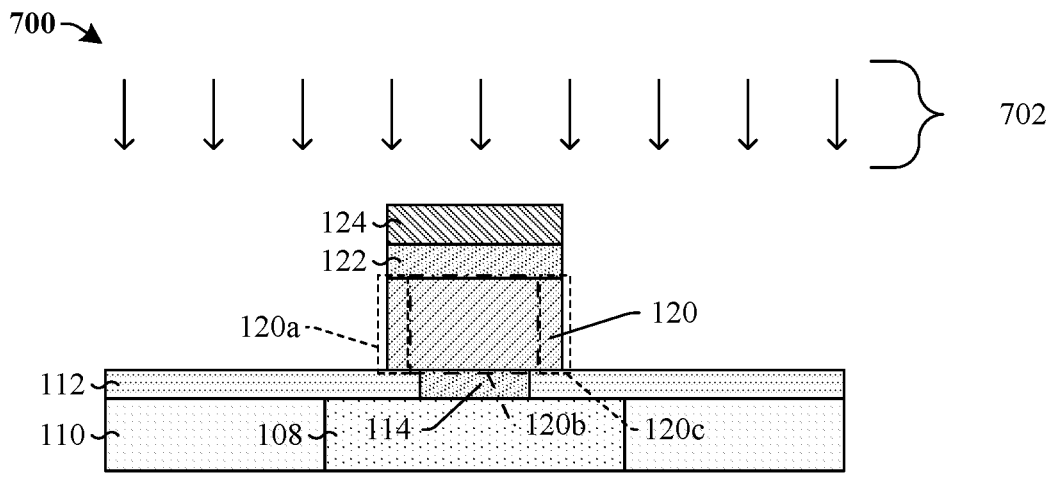

As shown in cross-sectional view 700 of FIG. 7, a first etching process is performed to remove a portion of the PCM stack (601 of FIG. 6) within the sacrificial regions (606 of FIG. 6) defining a PCE 120 and a top electrode 122. In some embodiments, the first etching process removes a portion of the hard mask 124 such that a thickness of the hard mask 124 before the first etching process is greater than the thickness of the hard mask 124 after the first etching process. In some embodiments, the first etching process is performed by exposing the PCM stack (601 of FIG. 6) within the sacrificial regions (606 of FIG. 6) to an etchant 702. The first etching process, for example, may be performed by a photolithography/etching process and/or some other suitable patterning process(es).

In some embodiments, the etchant 702 may be or comprise a reactive species. In various embodiments, the reactive species may, for example, be or comprise a halogen element such as fluorine (F), chlorine (Cl), bromine (Br), iodine (I), and/or astatine (At), or some other suitable element and/or compound that reacts and/or combines with a first outer region 120a and a second outer region 120c, while leaving a center region 120b made of the first material. Thus, center region 120b comprises the first material (e.g., GeSbTe), and the first and second outer regions 120a, 120c comprise a compound of the reactive species and the first material. In various embodiments, the compound may, for example, be or comprise GeSbTe combined with fluorine (F), chlorine (Cl), bromine (Br), iodine (I), and/or astatine (At). The compound has a first melting point temperature, a first boiling point temperature, and a first sublimation point temperature. The first material has a second melting point temperature, a second boiling point temperature, and a second sublimation point temperature. In some embodiments, the first melting point temperature, the first boiling point temperature, and the first sublimation point temperature are less than the second melting point temperature, the second boiling point temperature, and the second sublimation point temperature, respectively. In various embodiments, the first melting point temperature is within a range of approximately 250 degrees Celsius to approximately 350 degrees Celsius. In various embodiments, the second melting point temperature is approximately 600 degrees Celsius.

Figure 8A:
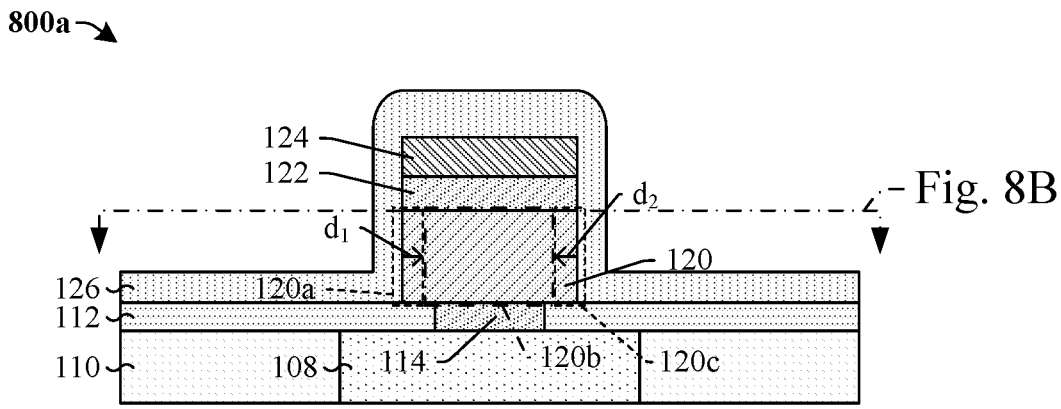

As shown in cross-sectional view 800a of FIG. 8A, a first deposition process is performed to form a first sidewall spacer 126 over the hard mask 124 and the dielectric layer 112. In some embodiments, the first sidewall spacer 126 may, for example, be or comprise a second material such as SiN. The first deposition process reaches a first maximum temperature. In various embodiments, the first maximum temperature is less than the first melting point temperature, the first boiling point temperature, and/or the first sublimation point temperature. In the aforementioned embodiment, the lower first maximum temperature of the first deposition process relative to the first melting, boiling, and/or sublimation point temperatures ensures the compound in the first and second outer regions 120a, 120c does not melt and/or evaporate and/or sublimate during the first deposition process. In various embodiments, after the first deposition process the PCE 120 is absent of voids such that the PCE 120 is a continuous layer from a lower surface of the top electrode 122 to an upper surface of the dielectric later 122 and an upper surface of the bottom electrode 114. In various embodiments, the first maximum temperature is approximately 250 degrees Celsius. In various embodiments, the first sidewall spacer 126 is configured to ensure the PCE 120 is not effected by subsequent processing steps and is not too thick (e.g., greater than approximately 30 nanometers) such that it will impact future etching processes, for example, such as a top electrode via etch and/or a BEOL process. The first deposition process may, for example, be performed by CVD, PVD some other suitable deposition process(es), or any combination of the foregoing.

In various embodiments, the first outer region 120a extends a non-zero first distance $d_1$ from a first sidewall of the PCE 120 and the second outer region 120c extends a non-zero second distance $d_2$ from a second sidewall of the PCE 120 such that the first and second sidewalls are opposing outer sidewalls. In various embodiments, the first and second outer sidewalls are defined in a cross-sectional view of the PCE 120. In various embodiments, the first and second distances $d_1$, $d_2$ are respectively within a range of approximately 0.01 nanometers and approximately 30 nanometers.

Figure 8B:
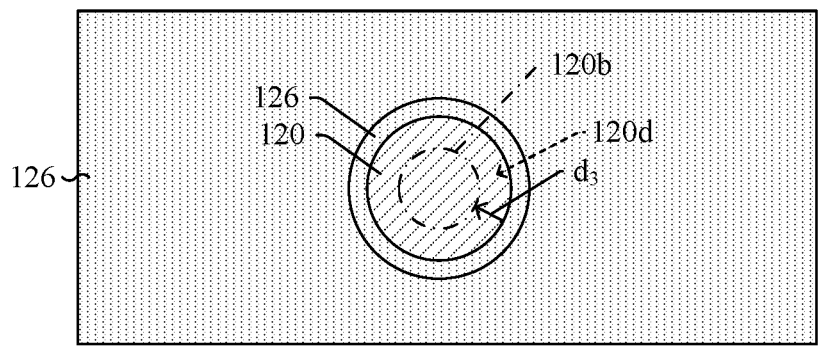

Referring to FIG. 8B, a top view 800b of FIG. 8A's cross sectional view 800a as indicated in the cut-away lines shown in FIG. 8A in accordance with some embodiments is provided. The PCM cell 116 may, for example, have a circular shape when viewed from above. The PCE 120 comprises the center region 120b and an outer region 120d. The outer region 120d is defined from an outer perimeter of the center region 120b to an outer perimeter of the PCE 120. In some embodiments, the outer region 120d comprises the first and second outer regions (120a, 120c of FIG. 8A). In some embodiments, the outer region 120d comprises the compound and/or the center region 120b comprises the first material. In various embodiments, the outer region 120d is a continuous layer absent of any voids.

In various embodiments, the outer region 120d extends a non-zero third distance $d_3$ from an outer perimeter of the PCE 120. In various embodiments, the third distance $d_3$ is within a range of approximately 0.01 nanometers and approximately 30 nanometers.

Figure 9:
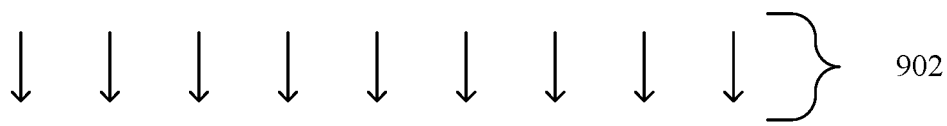
Figure 9:
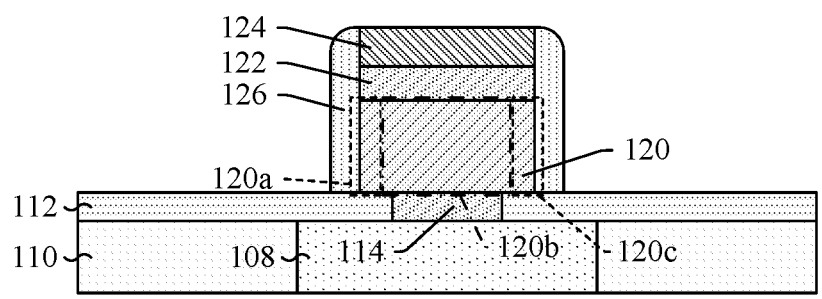

As shown in cross-sectional view 900 of FIG. 9, a second etching process is performed to remove a portion of the sidewall spacer 126. In some embodiments, the second etching process is performed by exposing the first sidewall spacer 126 to a second etchant 902. The second etching process, for example, may be performed by a photolithography/etching process and/or some other suitable patterning process(es). In some embodiments the second etchant 902 is different than the first etchant (702 of FIG. 7). In various embodiments, the second etching process is not performed and the method flows from FIGS. 8A and 8B directly to FIG. 10.

Figure 10:
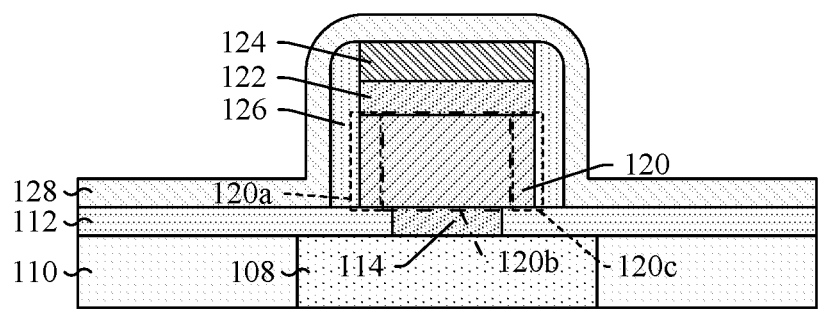

As shown in cross-sectional view 1000 of FIG. 10, a second deposition process is performed to form a second sidewall spacer 128 over the hard mask 124, the dielectric layer 112, and the first sidewall spacer 126. In some embodiments, the second sidewall spacer 128 may, for example, be or comprise a third material such as SiC. The second deposition process reaches a second maximum temperature. In various embodiments, the second maximum temperature is greater than the first melting, boiling, and/or sublimation point temperatures. In various embodiments, the second maximum temperature is greater than the first maximum temperature. In various embodiments, the second maximum temperature is approximately 350 degrees Celsius. The second deposition process may, for example, be performed by CVD, PVD, some other suitable deposition process(es), or any combination of the foregoing. In various embodiments, the PCE layer 120 is absent of any voids after the second deposition process.

Figure 11:
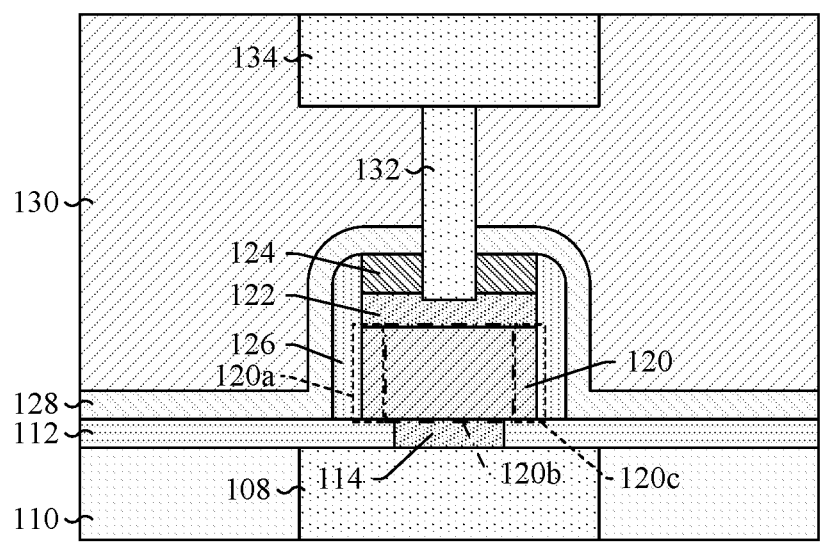

As shown in cross-sectional view 1100 of FIG. 11, a third deposition process is performed to form an IMD layer 130 over the second sidewall spacer 128. In some embodiments, the IMD layer may, for example, be or comprise an oxide, such as silicon dioxide, an extreme low κ dielectric, or the like. The third deposition process reaches a third maximum temperature. In various embodiments, the third maximum temperature is greater than the first melting, boiling, and/or sublimation point temperatures. In various embodiments, the third maximum temperature is greater than the first maximum temperature and/or is greater than the second maximum temperature. In various embodiments, the third maximum temperature is approximately 400 degrees Celsius. The third deposition process may, for example, be performed by CVD, PVD, a spin-on process, some other suitable deposition process(es), or any combination of the foregoing. In various embodiments, the PCE layer 120 is absent of any voids after the third deposition process.

A conductive via 132 is formed over and directly contacts the top electrode 122. An upper conductive wire 134 is formed over and directly contacts the conductive via 132. The conductive via 132 and upper conductive wire 134 may, for example, be formed by: patterning the IMD layer 130 to form via and/or wire openings with a pattern of the conductive via 132 and/or the upper conductive wire 134; depositing a conductive layer filling the via and/or wire openings and covering the IMD layer 130; and performing a planarization into the conductive layer until the IMD layer 130 is reached. The patterning may, for example, be performed by a photolithography/etching process and/or some other suitable patterning process(es).

Figure 12:
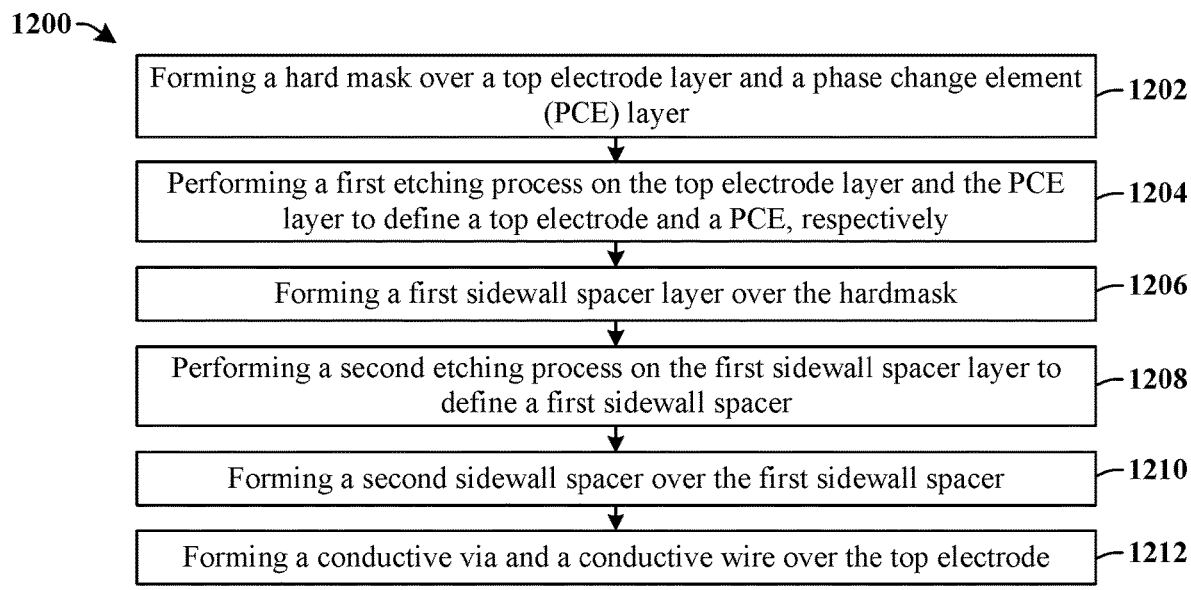
FIG. 12 illustrates a methodology in flowchart format that illustrates some embodiments of a method of forming a memory device, according to the present disclosure.

FIG. 12 illustrates a method 1200 of forming a memory device in accordance with some embodiments. Although the method 1200 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1202, a hard mask is formed over a top electrode layer and a phase change element (PCE) layer. FIG. 6 illustrates a cross-sectional view 600 corresponding to some embodiments of act 1202.

At act 1204, a first etching process is performed on the top electrode layer and the PCE layer to define a top electrode and a PCE. FIG. 7 illustrates a cross-sectional view 700 corresponding to some embodiments of act 1204.

At act 1206, a first sidewall spacer layer is formed over the hard mask. FIG. 8A illustrates a cross-sectional view 800*a* corresponding to some embodiments of act 1206.

At act 1208, a second etching process is performed on the first sidewall spacer layer to define a first sidewall spacer. FIG. 9 illustrates a cross-sectional view 900 corresponding to some embodiments of act 1208.

At act 1210, a second sidewall spacer is formed over the first sidewall spacer. FIG. 10 illustrates a cross-sectional view 1000 corresponding to some embodiments of act 1210.

At act 1212, a conductive via and a conductive wire are formed over the top electrode. FIG. 11 illustrates a cross-sectional view 1100 corresponding to some embodiments of act 1212.

Accordingly, in some embodiments, the present application relates to a memory device that comprises a first sidewall spacer in contact with outer sidewalls of a phase change element (PCE) and a second sidewall spacer in contact with outer sidewalls of the first sidewall spacer.

In various embodiments, the present application provides a method for forming a phase change random access memory (PCRAM) device, the method including: forming a memory stack over an insulator layer; performing a first etch process to pattern the memory stack defining a memory cell, wherein the memory cell comprises a top electrode overlying a dielectric layer, wherein the dielectric layer comprises a center region laterally between a first outer region and a second outer region, wherein an etchant used in the first etch process creates a compound in the first and second outer regions, and wherein the compound has a first melting point temperature; and performing a first deposition process to form a first sidewall spacer over the memory cell, wherein the first sidewall spacer is in direct contact with outer sidewalls of the memory cell, and wherein the first deposition process reaches a first maximum temperature less than the first melting point temperature.

In various embodiments, the present application provides a method for forming a memory device, the method including: forming a memory cell stack over a via within an insulator layer; performing a first patterning process on the memory cell stack to define a memory cell, the memory cell includes a top electrode overlying a phase change layer, wherein the phase change layer is comprises of a first material, wherein an etchant used during the first patterning process combines with the first material to form a compound in the phase change layer; performing a first deposition process to form a first sidewall spacer around the memory cell, such that the first sidewall spacer directly contacts outer sidewalls of the memory cell, wherein the first deposition process reaches a first maximum temperature, wherein the first maximum temperature is less than a melting point temperature of the compound; and performing a second deposition process to form a second sidewall spacer over the first sidewall spacer, wherein the second sidewall spacer extends continuously from an upper surface of the first sidewall spacer to an upper surface of the insulator layer, wherein the second deposition process reaches a second maximum temperature greater than the first maximum temperature.

In various embodiments, the present application provides a phase change random access memory (PCRAM) device including: a memory cell over an insulator layer, the memory cell includes a top electrode overlying a dielectric layer, wherein outer sidewalls of the top electrode are aligned with outer sidewalls of the dielectric layer; and a first sidewall spacer in contact with outer sidewalls of the memory cell; wherein the dielectric layer comprises a center region between a first outer region and a second outer region, wherein the center region comprises a first material, and wherein the first and second outer regions comprise a compound of the first material and a halogen element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a phase change random access memory (PCRAM) device, the method comprising:
    forming a memory stack over an insulator layer;
    performing a first etch process to pattern the memory stack defining a memory cell, wherein the memory cell comprises a top electrode overlying a dielectric layer, wherein the dielectric layer comprises a center region laterally between a first outer region and a second outer region, wherein an etchant used in the first etch process creates a compound in the first and second outer regions, and wherein the compound has a first melting point temperature; and
    performing a first deposition process to form a first sidewall spacer over the memory cell, wherein the first sidewall spacer is in direct contact with outer sidewalls of the memory cell, and wherein the first deposition process reaches a first maximum temperature less than the first melting point temperature.

2. The method of claim 1, wherein the dielectric layer is comprised of a first material, wherein the etchant comprises a halogen element such that the compound comprises the first material and the halogen element.

3. The method of claim 2, wherein the first material is germanium antimony tellurium (GeSbTe).

4. The method of claim 2, after the first deposition process the dielectric layer is a continuous uniform layer extending from a bottom surface of the top electrode to a top surface of the insulator layer.

5. The method of claim 2, wherein the first material has a second melting point temperature greater than the first melting point temperature.

6. The method of claim 1, further comprising:
    performing a second deposition process to form a second sidewall spacer over the first sidewall spacer, wherein a second maximum temperature of the second deposition process is greater than the first maximum temperature.

7. The method of claim 6, wherein the second maximum temperature is approximately equal to or greater than the first melting point temperature.

8. The method of claim 6, further comprising:
    performing a third deposition process to form an inter-level dielectric (ILD) layer over the second sidewall spacer, wherein a third maximum temperature of the third deposition process is greater than the second maximum temperature.

9. The method of claim 8, wherein the first melting point temperature is approximately 300 degrees Celsius, the first maximum temperature is approximately 250 degrees Celsius, the second maximum temperature is approximately 350 degrees Celsius, and the third maximum temperature is approximately 400 degrees Celsius.

10. A method for forming a memory device, the method comprising:
    forming a memory cell stack over a via within an insulator layer;
    performing a first patterning process on the memory cell stack to define a memory cell, the memory cell includes a top electrode overlying a phase change layer, wherein the phase change layer is comprised of a first material, wherein an etchant used during the first patterning process combines with the first material to form a compound in the phase change layer;
    performing a first deposition process to form a first sidewall spacer around the memory cell, such that the first sidewall spacer directly contacts outer sidewalls of the memory cell, wherein the first deposition process reaches a first maximum temperature, wherein the first maximum temperature is less than a melting point temperature of the compound; and
    performing a second deposition process to form a second sidewall spacer over the first sidewall spacer, wherein the second sidewall spacer extends continuously from an upper surface of the first sidewall spacer to an upper surface of the insulator layer, wherein the second deposition process reaches a second maximum temperature greater than the first maximum temperature.

11. The method of claim 10, further comprising:
    performing a third deposition process to form an inter-metal dielectric (IMD) layer over the second sidewall spacer, wherein the third deposition process reaches a third maximum temperature greater than the second maximum temperature.

12. The method of claim 11, wherein the first maximum temperature is approximately 250 degrees Celsius, the second maximum temperature is approximately 350 degrees Celsius, and the third maximum temperature is approximately 400 degrees Celsius.

13. The method of claim 11, wherein after the third deposition process the phase change layer is a continuous layer absent of any voids.

14. The method of claim 10, wherein the first sidewall spacer prevents diffusion of a diffusive species out of the phase change layer.

15. The method of claim 14, wherein the diffusive species is a compound including group 17 elements.

16. The method of claim 10, wherein the top electrode is centered relative to the phase change layer, and wherein a maximum width of the phase change layer is greater than a maximum with of the top electrode.

17. A phase change random access memory (PCRAM) device comprising:
    a memory cell over an insulator layer, the memory cell includes a top electrode overlying a phase change layer, wherein outer sidewalls of the top electrode are aligned with outer sidewalls of the phase change layer; and a first sidewall spacer in contact with outer sidewalls of the memory cell;

wherein the phase change layer comprises a center region between a first outer region and a second outer region, wherein the center region comprises a first material, and wherein the first and second outer regions comprise a compound of the first material and a halogen element.

18. The PCRAM device of claim 17, wherein the first material is germanium antimony tellurium (GeSbTe).

19. The PCRAM device of claim 17, further comprising:

a second sidewall spacer overlying the first sidewall spacer and the insulator layer, wherein the second sidewall spacer extends continuously from an upper surface of the first sidewall spacer to an upper surface of the insulator layer, and wherein the first sidewall spacer comprises a second material and the second sidewall spacer comprises a third material different than the second material.

20. The PCRAM device of claim 17, wherein the phase change layer is a continuous layer extending between a lower surface of the top electrode to an upper surface of the insulator layer.

* * * * *